(12) United States Patent
Smith et al.

(10) Patent No.: US 9,094,013 B2
(45) Date of Patent: Jul. 28, 2015

(54) SINGLE COMPONENT SLEEP-CONVENTION LOGIC (SCL) MODULES

(71) Applicant: THE BOARD OF TRUSTEES OF THE UNIVERSITY OF ARKANSAS, Little Rock, AR (US)

(72) Inventors: Scott C. Smith, Rogers, AR (US); Jia Di, Fayetteville, AR (US); Jerry Frenkil, Concord, MA (US); Aaron Arthurs, Springdale, AR (US); Ron Foster, Fayetteville, AR (US)

(73) Assignees: THE BOARD OF TRUSTEES OF THE UNIVERSITY OF ARKANSAS, Little Rock, AR (US); NANOWATT DESIGN, LLC, Fayetteville, AR (US)

( * ) Notice: Subject to any disclaimer, the term of this patent is extended or adjusted under 35 U.S.C. 154(b) by 139 days.

(21) Appl. No.: 13/902,225

(22) Filed: May 24, 2013

(65) Prior Publication Data

US 2014/0347097 A1    Nov. 27, 2014

(51) Int. Cl.
*G06F 7/38* (2006.01)
*H03K 19/173* (2006.01)

(52) U.S. Cl.
CPC .................... *H03K 19/173* (2013.01)

(58) Field of Classification Search
CPC ...................... G05B 2219/23316; G06F 21/81
USPC .......................... 326/46, 93, 95–98
See application file for complete search history.

(56) References Cited

U.S. PATENT DOCUMENTS

| | | |
|---|---|---|
| 5,305,463 A | 4/1994 | Fant et al. |
| 5,652,902 A | 7/1997 | Fant |
| 5,656,948 A | 8/1997 | Sobelman et al. |
| 5,664,211 A | 9/1997 | Sobelman et al. |
| 5,664,212 A | 9/1997 | Fant et al. |
| 5,828,228 A | 10/1998 | Fant et al. |
| 5,939,917 A | 8/1999 | Debaty |
| 6,023,185 A | 2/2000 | Galipeau et al. |
| 6,031,390 A | 2/2000 | Fant et al. |
| 6,043,674 A | 3/2000 | Sobelman |

(Continued)

OTHER PUBLICATIONS

Mutoh, Shin'Ichiro et al., "1-V Power Supply High-Speed Digital Circuit Technology with Multithreshold-Voltage CMOS," IEEE Journal of Solid-State Circuits, Aug. 8, 1995, vol. 30, No. 8, pp. 847-854.

(Continued)

*Primary Examiner* — Jason M Crawford
(74) *Attorney, Agent, or Firm* — Michael Best & Friedrich LLP

(57) ABSTRACT

A multi-rail module having mutually exclusive outputs. The module includes first and second-rail logic circuits, first and second-rail driver circuits, and a PMOS transistor sourcing $V_{DD}$ to both the first and second driver circuits. The first-rail logic circuit is coupled to $V_{DD}$ and ground and has a first logic input and a first logic output. The second-rail logic circuit is coupled to $V_{DD}$ and ground and has a second logic input and a second logic output. The first-rail driver circuit is coupled to ground, receives the first logic output, and has a first-rail output $Q^1$. The second-rail driver circuit is coupled to ground, receives the second logic output, and has a second-rail output $Q^0$. The PMOS transistor has a gate driven by a SLEEP signal.

17 Claims, 9 Drawing Sheets

(56) References Cited

U.S. PATENT DOCUMENTS

| | | | |
|---|---|---|---|
| 6,052,770 A | | 4/2000 | Fant |
| 6,140,836 A | * | 10/2000 | Fujii et al. ................. 326/35 |
| 6,208,171 B1 | * | 3/2001 | Kumagai et al. ............ 326/121 |
| 6,225,827 B1 | * | 5/2001 | Fujii et al. ................. 326/98 |
| 6,262,593 B1 | | 7/2001 | Sobelman et al. |
| 6,333,640 B1 | | 12/2001 | Fant et al. |
| 6,867,620 B2 | | 3/2005 | Singh et al. |
| 6,900,658 B1 | | 5/2005 | Sobelman et al. |
| 6,946,869 B2 | | 9/2005 | Jacobson et al. |
| 7,051,306 B2 | | 5/2006 | Hoberman et al. |
| 7,215,155 B2 | | 5/2007 | Won et al. |
| 7,400,175 B2 | | 7/2008 | Fallah et al. |
| 7,415,680 B2 | | 8/2008 | Hoberman et al. |
| 7,511,535 B2 | * | 3/2009 | Chakraborty et al. ....... 326/93 |
| 7,821,293 B2 | | 10/2010 | Fazzi et al. |
| 7,977,972 B2 | | 7/2011 | Di et al. |
| 8,207,758 B2 | * | 6/2012 | Di et al. ................. 326/120 |
| 8,664,977 B2 | * | 3/2014 | Di et al. ................. 326/121 |
| 2004/0080340 A1 | * | 4/2004 | Hidaka ................. 326/83 |
| 2005/0242862 A1 | * | 11/2005 | Won et al. ................. 327/218 |
| 2007/0126486 A1 | * | 6/2007 | Lee et al. ................. 327/218 |
| 2008/0276105 A1 | | 11/2008 | Hoberman et al. |
| 2009/0152948 A1 | | 6/2009 | Hoberman et al. |
| 2011/0032000 A1 | * | 2/2011 | Di et al. ................. 326/98 |
| 2013/0181740 A1 | * | 7/2013 | Smith et al. ................. 326/46 |

OTHER PUBLICATIONS

Fant, K.M. et al., "NULL convention logic: a complete and consistent logic for asynchronous digital circuit synthesis," International Conference on Application Specific Systems, Architectures and Processors, 1996, pp. 261-273.

Sobelman, G.E. et al., "CMOS circuit design of threshold gales with hystereis," IEEE International Symposium on Circuits and Systems (II), 1998, pp. 61-65.

Kao et al., "Dual-Threshold Voltage Techniques for Low-Power Digital Circuits," IEEE Journal of Solid-State Circuits, Jul. 2000, vol. 35, No. 7, pp. 1009-1018.

Smith, S.C. et al., "Delay-insensitive gate-level pipelining," Elsevier's Integration, the VLSI Journal, Oct. 2001, 30(2):103-131.

Smith, S.C., "Speedup of self-timed ditigal systems using early completion," IEEE Computer Society Annual Symposium on VLSI (Apr. 2002) pp. 107-113.

Smith, S.C. et al., "Optimization of NULL convention self-timed circuits," The VLSI Journal (2004) 37(3):135-165.

Lakshmikanthan, P. et al., "Design of ultra-low power combinational standard library cells using a novel leakage reduction methodology," IEEE International SOC Conference (2006) 2 pages.

Bailey, A.D. et al., "Multi-threshold asynchronous circuit design for ultra-low poer," J. Low Power Electronics, 2008, 4(3):337-348.

Bailey, A.D. et al., "Ultra-low power delay-insensitive circuit design," IEEE Midwest Symposium on Circuits and Systems, Aug. 20, 2008, pp. 503-506.

Smith, et al., "Designing Asynchronous Circuits Using NULL Convention Logic (NCL)," Morgan & Claypool Publishers, 2009.

Al Zahrani, A. et al., "Glitch-free design for multi-threshold CMOS NCL circuits," 2009 Great Lakes Symposium on VLSI, May 2009, pp. 215-220.

Liang Zhou, "Ultra-Low Power and Radiation Hardened Asynchronous Circuit Design," A dissertation submitted in partial fulfillment of the requirements for the degree of Doctor of Philosophy in Electrical Engineering, University of Arkansas, May 2012.

* cited by examiner

US 9,094,013 B2

SINGLE COMPONENT SLEEP-CONVENTION LOGIC (SCL) MODULES

BACKGROUND

The present invention relates to Sleep-Convention Logic (SCL) modules, specifically SCL modules designed as single components.

Present SCL modules are designed using multiple individual SCL gates. Individual gates are combined to form larger modules (e.g., adders, registers, etc.). While this is an easy way to design these modules, penalties in size, speed, and power are incurred.

SUMMARY

The invention improves upon the Multi-Threshold NULL Convention Logic (MTNCL) disclosed in U.S. Pat. No. 7,977,972 (the '972 patent), filed on Apr. 30, 2010, and U.S. patent application Ser. No. 13/739,778, filed on Jan. 11, 2013, the entire content of each are hereby incorporated by reference. SCL and MTNCL are equivalent logic schemes.

In one embodiment, the invention provides a multi-rail module having mutually exclusive outputs. The module includes first and second-rail logic circuits, first and second-rail driver circuits, and a PMOS transistor sourcing $V_{DD}$ to both the first and second driver circuits. The first-rail logic circuit is coupled to $V_{DD}$ and ground and has a first logic input and a first logic output. The second-rail logic circuit is coupled to $V_{DD}$ and ground and having a second logic input and a second logic output. The first-rail driver circuit is coupled to ground, receives the first logic output and has a first-rail output $Q^1$. The second-rail driver circuit is coupled to ground, receives the second logic output, and has a second-rail output $Q^0$. The PMOS transistor has a source coupled to $V_{DD}$, a drain coupled to the first driver circuit and the second driver circuit, and a gate driven by a SLEEP signal. When the SLEEP signal is low, the PMOS transistors sources $V_{DD}$ to the first driver circuit and the second driver circuit.

In another embodiment, the invention provides a method of designing a multi-rail module. The method includes coupling a logic output of a first-rail logic circuit to an input of a first-rail driver circuit, coupling a logic output of a second-rail logic circuit to an input of a second-rail driver circuit, and sourcing $V_{DD}$ to the first-rail driver circuit and the second-rail driver circuit via a single PMOS transistor.

In one embodiment, the invention provides a Sleep-Convention Logic (SCL) module having mutually exclusive outputs. The module includes first and second-rail logic circuits, first and second-rail driver circuits, and a PMOS transistor sourcing $V_{DD}$ to both the first and second driver circuits. The first-rail logic circuit is coupled to $V_{DD}$ and ground and has a first logic input and a first logic output. The second-rail logic circuit is coupled to $V_{DD}$ and ground and having a second logic input and a second logic output. The first-rail driver circuit is coupled to ground, receives the first logic output and has a first-rail output $Q^1$. The second-rail driver circuit is coupled to ground, receives the second logic output, and has a second-rail output $Q^0$. The PMOS transistor has a source coupled to $V_{DD}$, a drain coupled to the first driver circuit and the second driver circuit, and a gate driven by a SLEEP signal. When the SLEEP signal is low, the PMOS transistors sources $V_{DD}$ to the first driver circuit and the second driver circuit.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

In the specification and claims the use of the term coupled refers to a direct connection or an indirect connection (i.e., from a transistor lead to ground or connected through one or more additional components, e.g., a circuit connected to ground through another transistor).

The invention creates standard Sleep-Convention Logic (SCL) modules (e.g., register, multiplexer, half adder, full adder) as single components; versus modules designed using multiple SCL gates. This allows some SLEEP transistors to be shared such that each component requires fewer SLEEP transistors than if the component is comprised of individual SCL gates. Additionally, other transistors within a component can be shared. Using SCL components instead of only SCL gates yields a circuit that is smaller, faster, and utilizes less energy per operation and less leakage power than the current patented SCL methodology.

The invention is used as an alternative method to design computer chips, especially when power usage is a major concern. Potential applications that would benefit from the SCL circuit design methodology include cell phones, smart phones, PDAs, pagers, MP3 players, handheld GPSs, walky-talkies, wireless sensor networks, smart cards, laptop computers, any type of mobile electronics, microcontrollers, microprocessors, and 3D ICs.

An output driver for multiple-rail (SCL) cells is disclosed as an example of the invention. The driver shares the pull-up circuitry between the multiple output-rails to minimize area and Sleep control input capacitance. Various configurations and functional expansions are described below which enhance the functionality of the driver while maintaining the shared pull-up in a power, area, and timing in an efficient manner.

Figure 1:
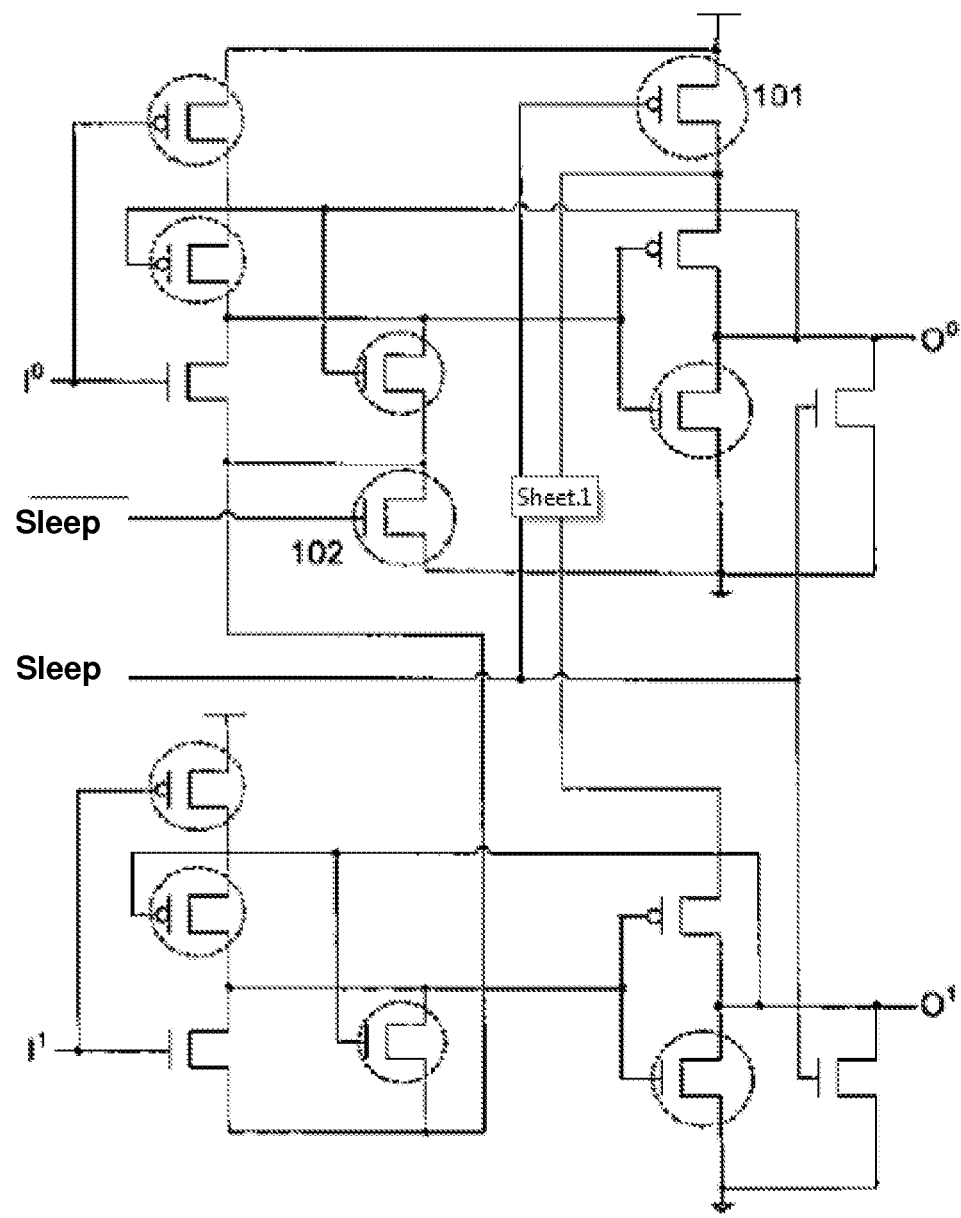
FIG. 1 is a schematic diagram of an SCL register with SLEEP and NSLEEP inputs.
Figure 2:
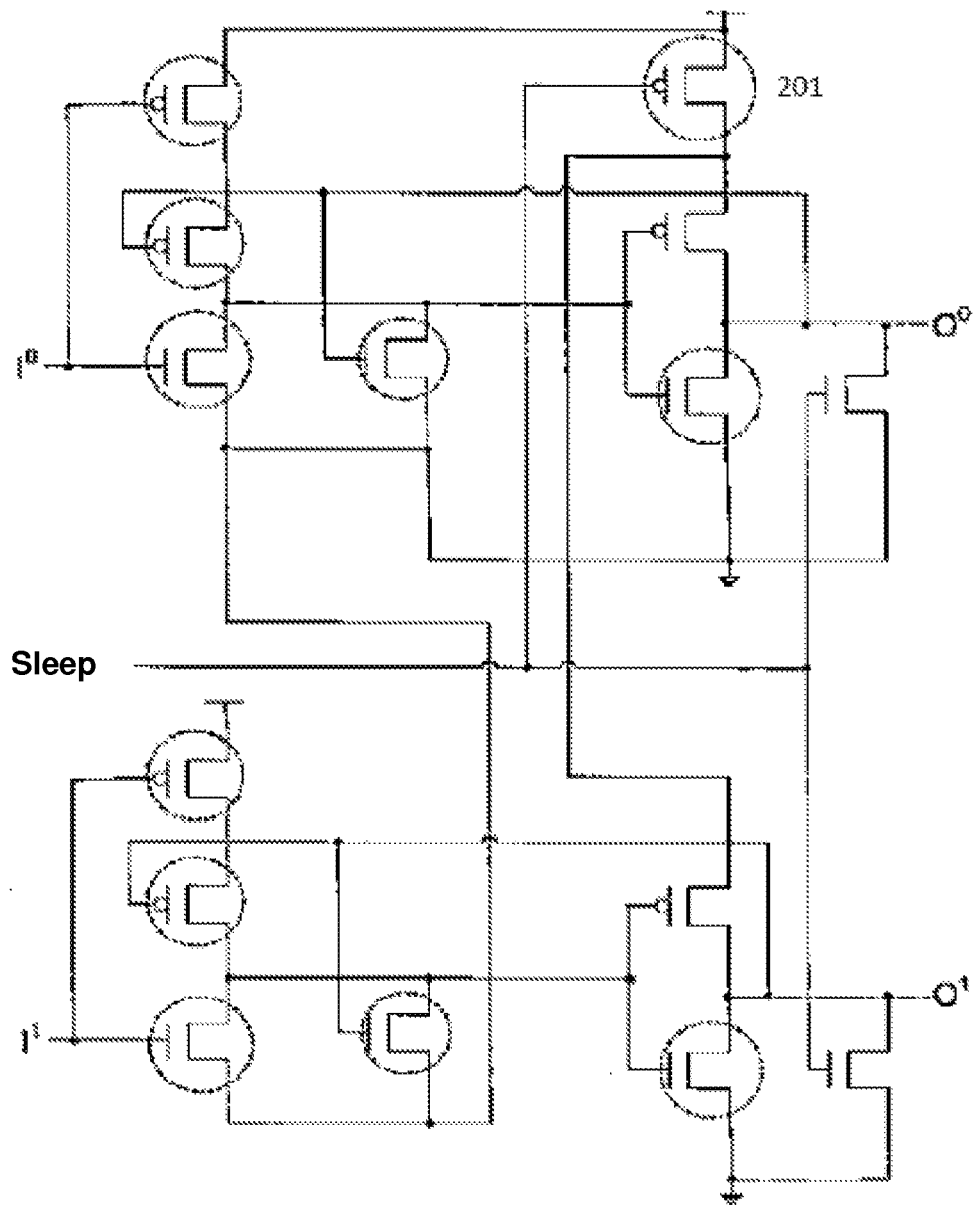
FIG. 2 is a schematic diagram of an SCL register without an NSLEEP input.

FIG. 1 shows an example of a dual-rail SCL register, with both SLEEP and NSLEEP (inverted SLEEP). The SCL register is designed as an SCL component so as to share SLEEP transistors 101 and 102. FIG. 2 shows another example of a dual-rail SCL register, this time without NSLEEP. This register is designed as an SCL component so as to share SLEEP transistor 201.

SCL circuits communicate via multi-rail signaling in which logic values are encoded on the multiple-rails. For example, Table 1 illustrates the encoding for a Dual-Rail signal and Table 2 illustrates the encoding for a Quad-Rail signal.

In effect, a Dual-rail signal D consists of two wires or-rails, D0 and D1, which may assume any value from the set {DATA0, DATA1, NULL} as depicted in Table 1. The DATA0 state corresponds to a Boolean logic 0, the DATA1 corresponds to a Boolean logic 1, and the NULL state corresponds to the empty set (meaning that the value of D is not yet available, a fundamental concept in SCL design). Note that the two-rails are mutually exclusive, such that both-rails can never be asserted simultaneously (defined as an illegal state).

TABLE 1

Dual-Rail signal logic values
DUAL-RAIL SIGNAL

|  | DATA0 | DATA1 | NULL | Illegal |
|---|---|---|---|---|
| $D^0$ | 1 | 0 | 0 | 1 |
| $D^1$ | 0 | 1 | 0 | 1 |

TABLE 2

Quad-Rail signal logic values
QUAD-RAIL SIGNAL

|  | DATA0 | DATA1 | DATA2 | DATA3 | NULL |
|---|---|---|---|---|---|
| $Q^0$ | 1 | 0 | 0 | 0 | 0 |
| $Q^1$ | 0 | 1 | 0 | 0 | 0 |
| $Q^2$ | 0 | 0 | 1 | 0 | 0 |
| $Q^3$ | 0 | 0 | 0 | 1 | 0 |

Similarly, a quad-rail signal Q consists of four wires, $Q^0$, $Q^1$, $Q^2$, and $Q^3$, which may assume any value from the set {DATA0, DATA1, DATA2, DATA3, NULL} as depicted in Table 2. The DATA0 state corresponds to two Boolean logic signals, X and Y, where X=0 and Y=0; the DATA1 state corresponds to X=0 and Y=1, and so forth and so on. The four-rails of a quad-rail SCL signal are mutually exclusive such that no more than one-rail can ever be asserted simultaneously (again, these states are defined as illegal states).

This mutual exclusivity amongst the-rails in multi-rail signaling is a feature that is exploited by the multi-rail output driver.

Figure 3:
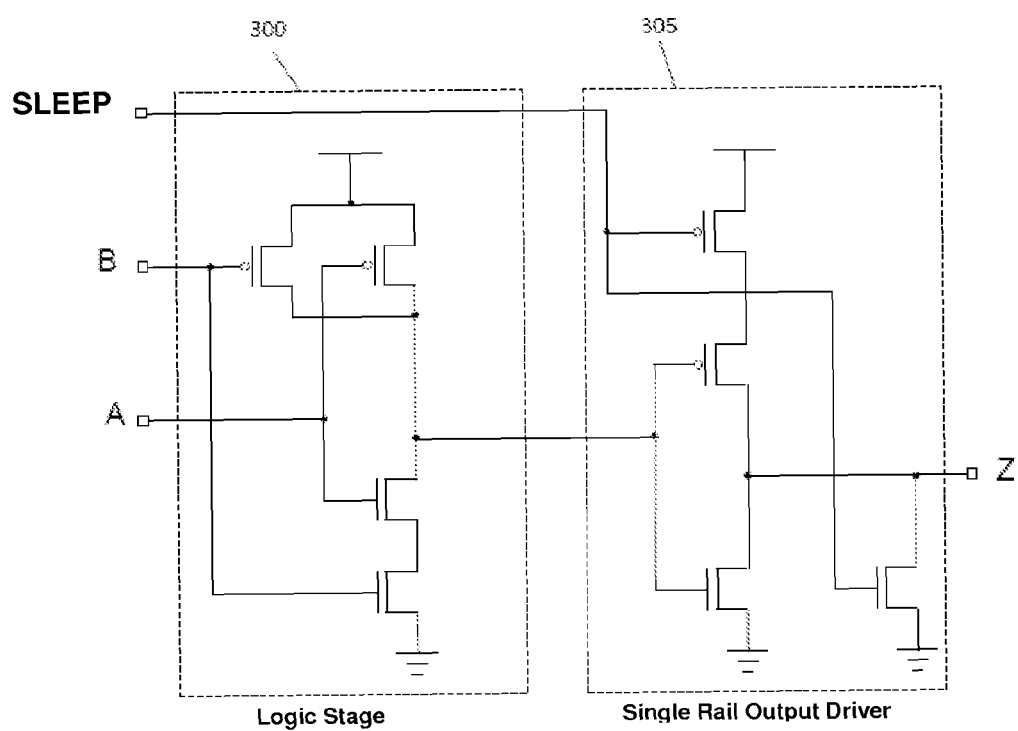
FIG. 3 is a schematic diagram of a single-rail SCL AND gate.

In SCL, the output driver serves multiple purposes: (a) to invert the signal received from the input logic stage to form non-inverting logic functions, (b) to buffer the input logic stage from the load capacitance, and (c) to force the cell into a Sleep state upon receiving an asserted SLEEP signal. FIG. 3 illustrates the circuit topology for a single-rail 2-input SCL AND gate (also referred to as a STH22 gate), including a logic stage 300 receiving the two inputs A and B, and a single-rail output driver 305 receiving SLEEP input and the output of the Logic Stage 300.

The cell is put to sleep by the assertion (logic high) of the SLEEP input, which forces the output low. (An SCL circuit is considered to be in the SLEEP state when the output is low due to the assertion of the SLEEP input). When SLEEP is de-asserted (logic low), the output pin Z may be pulled high depending upon the state of the logic stage output.

The multi-rail output driver accomplishes the same goals as the single-rail output driver (signal inversion, buffering, adding sleep functionality) for multi-rail cells, but without duplicating all of the output driver circuitry for each of the outputs on the multi-rail cell. The avoidance of this duplication results in significant improvements in power, area, and timing, all of which are first order design metrics.

Figure 4:
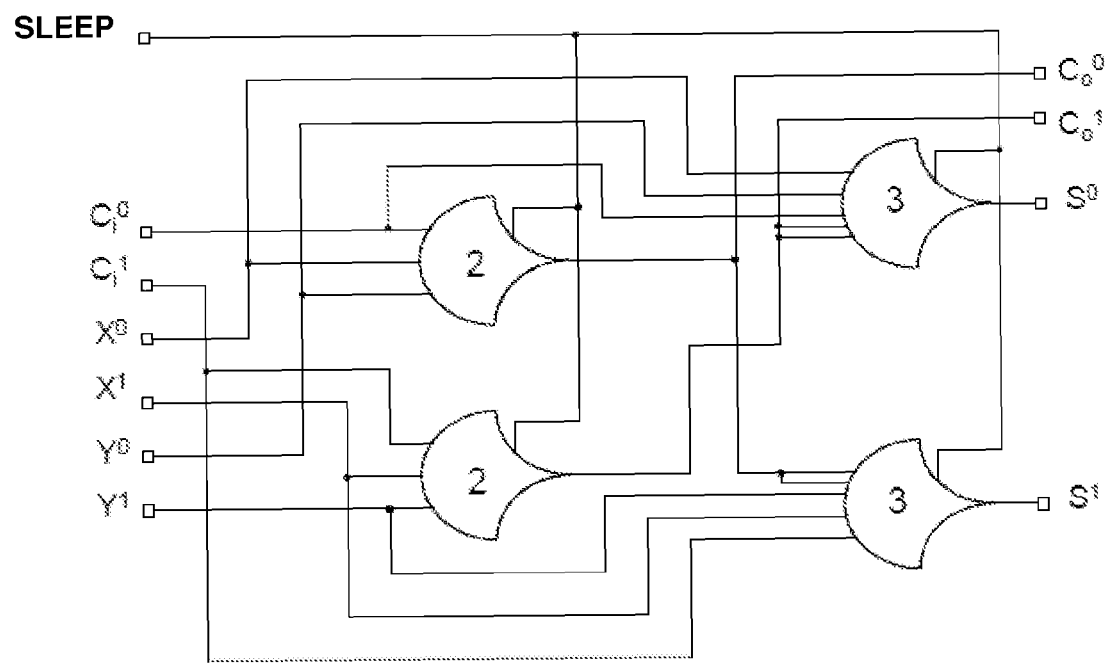
FIG. 4 is a schematic diagram of a prior art Dual-rail SCL Full-Adder.

The existing state of the art in dual-rail (and multi-rail) SCL design is to form multi-rail logic functions out of multiple single-rail logic functions (such as that shown in FIG. 3). FIG. 4 below illustrates a dual-rail Full-Adder cell that is constructed out of two STH23 gates and two STH34W2 gates.

The schematic illustrates that two output pins are implemented for each output function: $C_O^0$ and $C_O^1$ for the carry-out output and $S^0$ and $S^1$ for the Sum output. Commensurately, two SCL cells are used to drive each output pair, each cell with its own single-rail output driver stage.

The multi-rail output driver improves upon this situation by sharing transistors and functions between two dual-rail outputs. This sharing improves several first order design metrics: area is reduced, SLEEP pin input capacitance is significantly reduced, and the power consumption incurred in putting the cell to sleep is also significantly reduced. The latter metric is of particular importance as SCL technology is targeted at low power systems.

Layout and power efficiency of multi-rail SCL circuits are improved by taking advantage of the mutually-exclusive state characteristics of the multi-rail outputs. In particular, the pull-up circuitry used to force a multi-rail output high is shared amongst all the related multi-rail outputs since, in SCL design, no two multi-rail outputs can be high at the same time.

Figure 5:
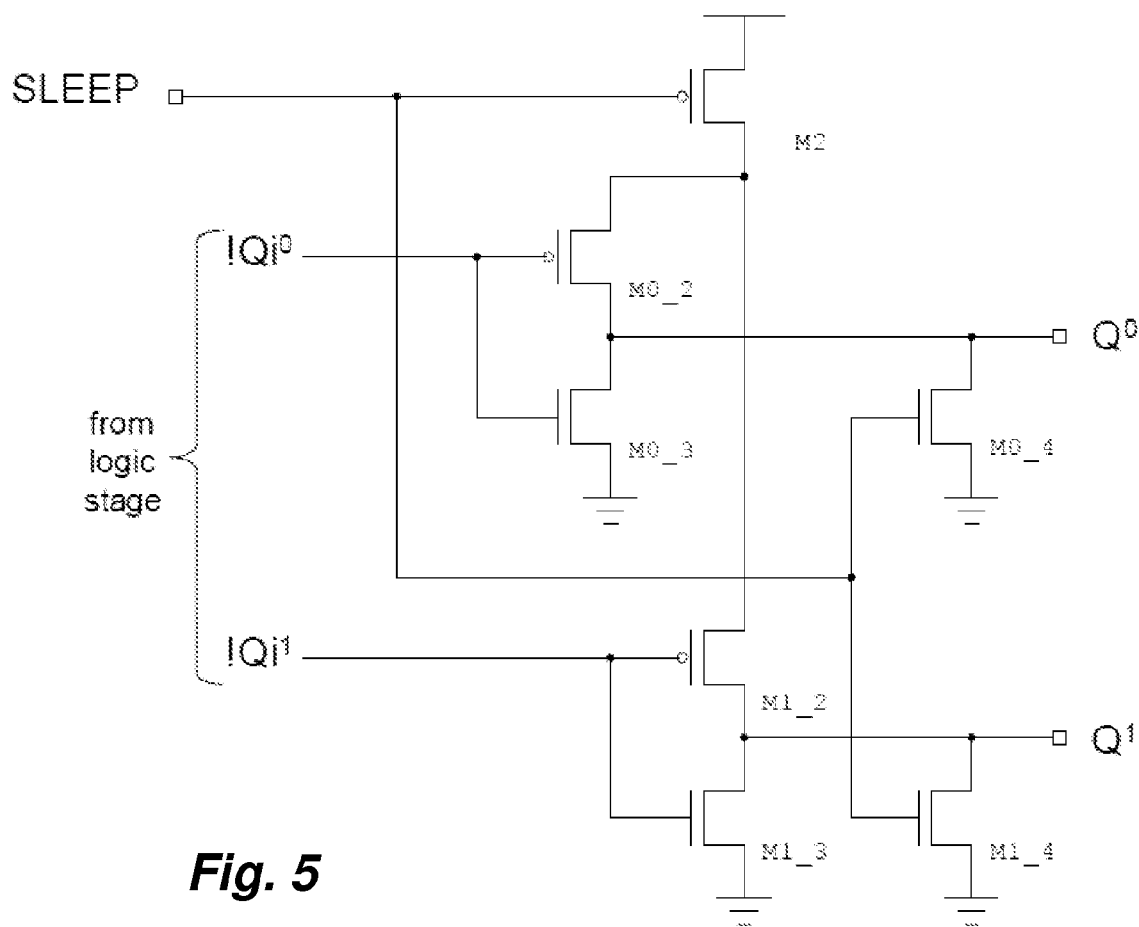
FIG. 5 is a schematic diagram of a Dual-rail Output driver.

A dual-rail output driver is illustrated in FIG. 5. A dual-rail driver, instead of a multi-rail driver, is described below for simplicity's sake, since the operation of multi-rail driver is identical to that of a dual-rail driver except for the fact that more outputs share the common shared circuitry.

Transistors M0_2, M0_3, and M0_4 comprise the rail_0 circuitry, transistors M1_2, M1_3, and M1_4 comprise the rail_1 circuitry, and transistor M2 is the shared circuitry. As shown in Table 1, when a dual-rail value of DATA0 is asserted, the $Q^0$ output is driven high (through transistors M0_2 and M2) while the $Q^1$ output is driven low (through transistor M1_3). Similarly, when a dual-rail value of DATA1 is asserted, the $Q^0$ output is driven low (through transistor M0_3) while the $Q^1$ output is driven high (through transistor M1_2 and M2). A dual-rail value of NULL is asserted by driving both the $Q^0$ and $Q^1$ outputs low through transistors M0_4 and M1_4 while transistor M2 is off, isolating both outputs from the logic stage, or from propagating a NULL from the logic stage through transistors M0_3 and M1_3.

Figure 6A:
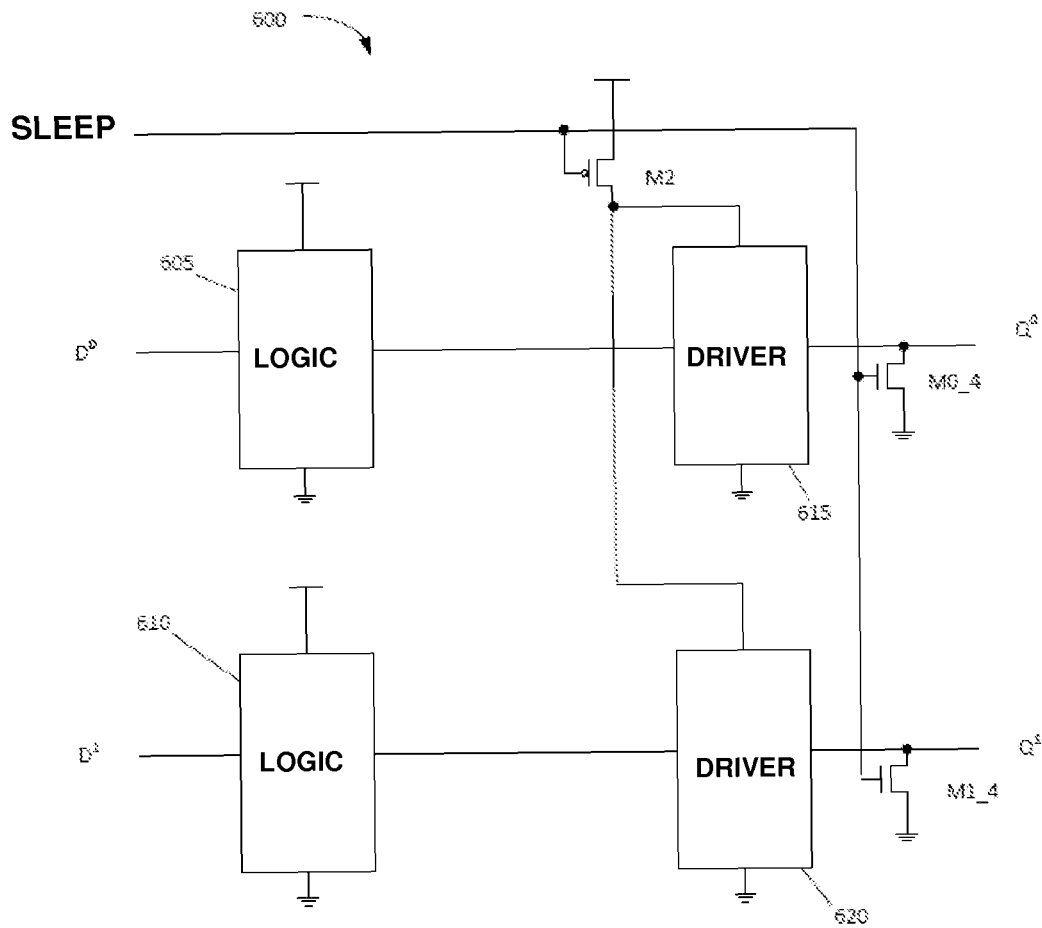
FIG. 6A is a schematic/block diagram of an SCL register with a Dual-rail Output driver.
Figure 6B:
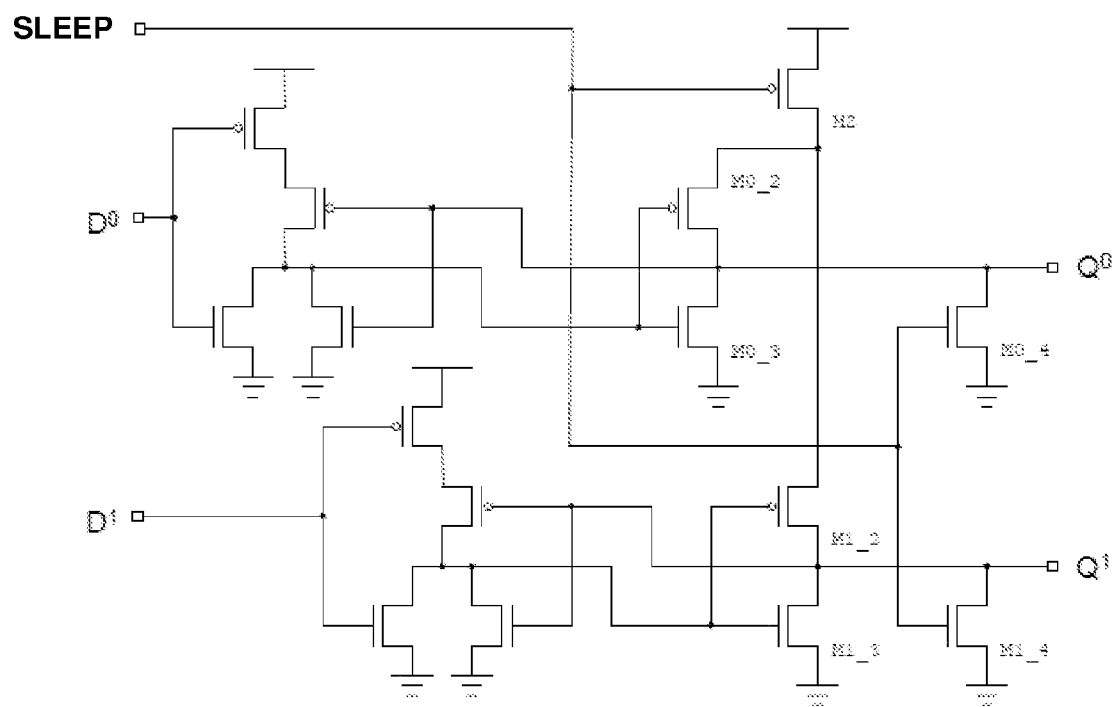
FIG. 6B is a schematic diagram of an SCL register with a Dual-rail Output driver.

The key element here is the sharing of the pull-up transistor M2 amongst multiple outputs that are all mutually exclusive with each other in regards to their ability to be driven to a high state. This is the simplest form of a multi-rail driver and can be applied to a wide variety of logic functions such as the full-adder (shown in FIG. 4), half-adder, multiplexer, register, decoder, and so forth. An SCL register 600 with a dual-rail output driver is shown in FIGS. 6A and 6B.

The SCL register 600 includes a first-rail logic circuit 605, a second-rail logic circuit 610, a first-rail driver circuit 615, a second-rail driver circuit 620, and a SLEEP circuit including a first PMOS transistor M2, a first NMOS transistor M0_4, and a second NMOS transistor M1_4.

Careful analysis of this register design shows that this circuit has a noteworthy characteristic which is important for satisfying logic architecture requirements: the outputs of this cell can be driven high by the inputs $D^0$ and $D^1$, but cannot be driven low. Only the SLEEP input can drive the output low. This characteristic impacts design considerations for cells with multiple functions and leads to the requirement for a more complex output driver.

More complex forms of the driver include logic functions with direct set or direct reset capabilities. For example, registers often contain such set or reset capabilities in addition to their primary function of storing data. In such cases, the register must be able, upon assertion of the set or reset input control pin, to force the register state and the register outputs to the appropriate state such as DATA0 or DATA1. Since, as noted above, the input logic cannot force an output low, this must be accomplished in the output driver.

Figure 7A:
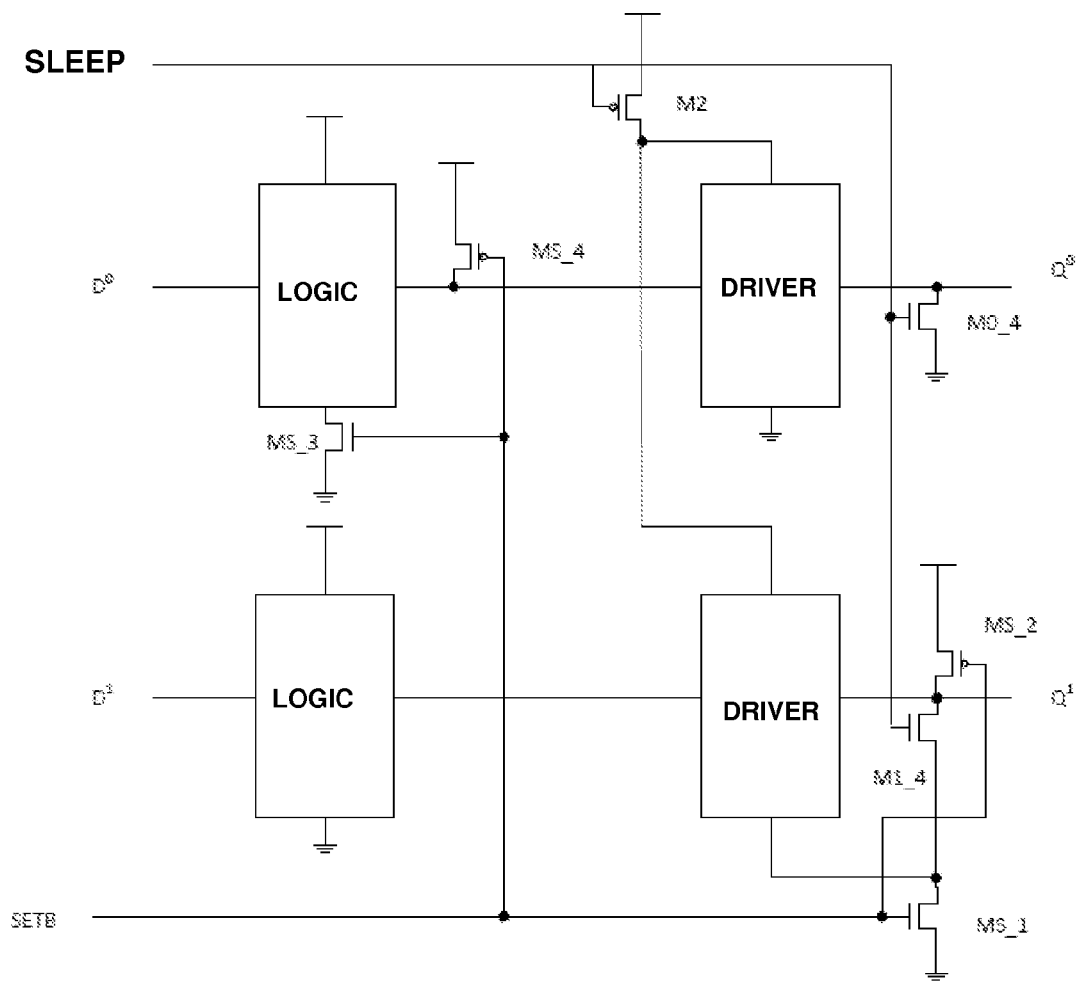
FIG. 7A is a schematic/block diagram of a settable SCL register with a Dual-rail Output driver.
Figure 7B:
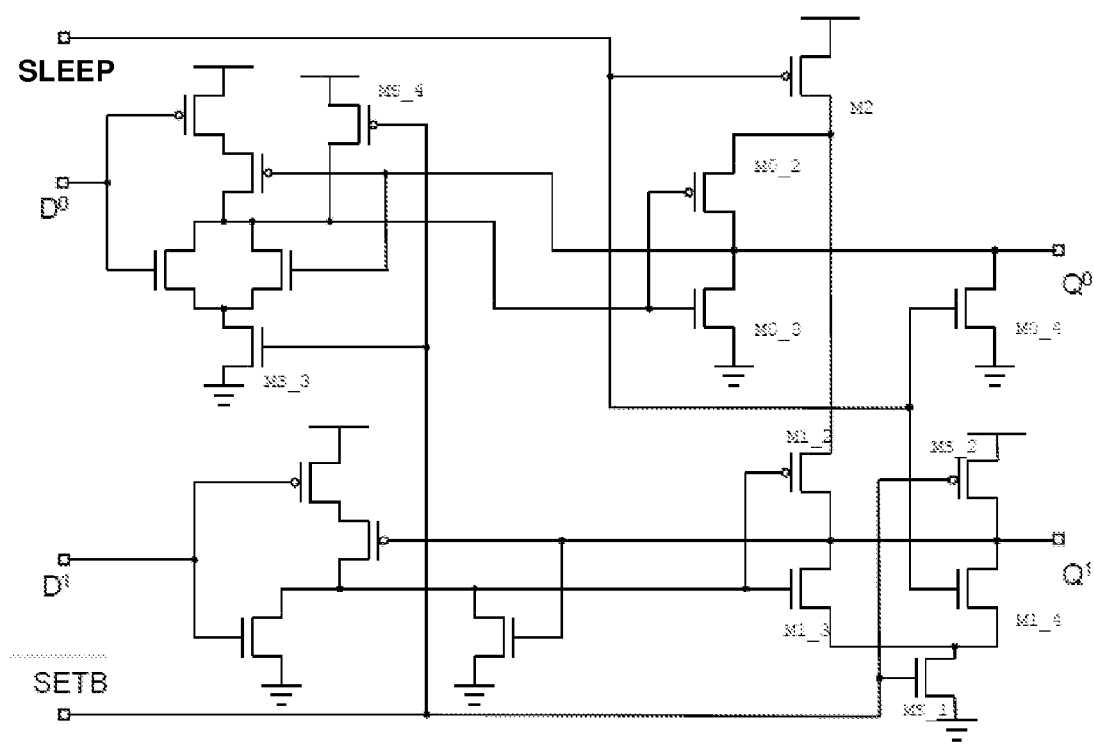
FIG. 7B is a schematic diagram of a settable SCL register with a Dual-rail Output driver.

FIGS. 7A and 7B illustrate a Settable version of the basic dual-rail register shown in FIGS. 6A and 6B. Transistors MS_1, MS_2, MS_3, and MS_4 comprise the circuitry added to the base register to implement the Set function. As can be seen, a portion of the Set function is implemented within the logic section of the register and a portion is implemented within the driver section. When the SETB input is asserted low, the $Q^0$ output is forced to the low state and the $Q^1$ output is forced to the high state; in other words the dual-rail output is forced, or set, to the DATA1 state.

Implementing the Set function in this mixed manner, modifying both the logic and driver, has several advantages over implementing the Set function in the output driver only. One advantage is that the transistors added to the logic section (transistors MS_3 and MS_4 in FIG. 7) can be sized much smaller than transistors that might be added to the driver section since the load driven by the logic section is much smaller than the load driven by the output driver transistors. Smaller transistor sizes, in this case, result in less layout area and less power consumption. Additionally, the mixed implementation avoids the need to invert the SETB input which otherwise would be required if all of the reset functionality was implemented in either the logic section or the driver section.

Another beneficial attribute of this implementation is the choice of active low set. While SCL is a positive logic system, using an active low reset avoids the need to place a PMOS transistor in series with the shared pull-up transistor M2. Use of a series transistor in series with M2 would result in both increased area and degraded switching performance. In particular, series, or stacked PMOS transistors, have significantly degraded switching performance. Countering degraded switching performance typically requires increased sizing of M2 and other transistors, resulting in further increases in area and dynamic power.

Similar circuit concepts can also be employed to create a Resettable Dual-Rail register, in which case the same concepts and circuit techniques used for the Settable Dual-Rail register are used. A minor difference between the two is that with a Resettable register the additional transistors are added to the $D^1$ logic section and $Q^0$ output section instead of the $D^0$ logic section and the $Q^1$ output section, respectively.

The register is used as an example, and these concepts, sharing the output pull-up transistor and adding set, reset, or similar functionality in such a way as to avoid the use of a PMOS series transistor in the output driver, can also be applied to other functions.

The invention is part of a set of essential design techniques needed to design complete System-on-Chips (SoC), as most registers within an SoC must be Settable or Resettable. As the target usage for SCL is Ultra-Low Power Design, power-efficient circuit design techniques are highly valued. This invention enables the design of power-efficient dual-rail SCL circuits, especially when applied to circuit functions that involve a secondary control such as Set or Reset. The invention raises the technological barrier for metrics of power efficiency and area.

PMOS Sleep transistors must be sized to discharge all rail outputs within a given time constraint. With multi-rail circuits, at most a single rail output is logic high. Therefore, the drive strength of the PMOS Sleep transistor can be sized to discharge only a single rail output, as opposed to being sized to discharge the outputs of ALL rails within a given time constraint. With SCL, logic must be slept once per operation, since energy usage is related to the input capacitance of the sleep transistors, significant energy and area savings are achieved due to the reduced sleep input capacitance by sizing the PMOS Sleep transistor to discharge only a single rail output.

What is claimed is:

1. A multi-rail module having mutually exclusive outputs, the module comprising:
   a first-rail logic circuit coupled to $V_{DD}$ and coupled to ground and having a first logic input and a first logic output;
   a second-rail logic circuit coupled to $V_{DD}$ and coupled to ground and having a second logic input and a second logic output;
   a first-rail driver circuit coupled to ground, receiving the first logic output, and having a first-rail output $Q^1$;
   a second-rail driver circuit coupled to ground and receiving the second logic output and having a second-rail output $Q^0$;
   a PMOS transistor having a source coupled to $V_{DD}$, a drain coupled to the first driver circuit and the second driver circuit, and a gate driven by a SLEEP signal; and
   a SET circuit, the SET circuit driving the first-rail logic circuit such that the first-rail output $Q^0$ output is low when a SETB input is asserted low, and driving the second-rail driver circuit such that the second-rail output $Q^1$ output is high when the SETB input is asserted low;
   wherein when the SLEEP signal is low, the PMOS transistor sources $V_{DD}$ to the first driver circuit and the second driver circuit.

2. The multi-rail module of claim 1, further comprising a first SLEEP NMOS transistor having a source coupled to the first-rail output, a drain coupled to ground, and a gate driven by the SLEEP signal, and a second SLEEP NMOS transistor having a source coupled to the second-rail output, a drain coupled to ground, and a gate driven by the SLEEP signal.

3. The multi-rail module of claim 2, further comprising a SET circuit including
   a first set PMOS transistor having a source coupled to $V_{DD}$, a drain coupled to the first logic output, and a gate coupled to a SETB input,
   a first set NMOS transistor coupled between the first-rail logic circuit and ground, the first set NMOS transistor having a source coupled to the first-rail logic circuit, a drain coupled to ground, and a gate coupled to the SETB input,
   a second set PMOS transistor having a source coupled to VDD, a drain coupled to the second-rail output $Q^1$, and a gate coupled to a SETB input, and
   a second set NMOS transistor coupled between the second-rail driver circuit and ground, and between the second SLEEP NMOS transistor and ground, the second set NMOS transistor having a source coupled to the second-rail driver circuit and the drain of the second SLEEP NMOS transistor, a drain coupled to ground, and a gate coupled to a SETB input.

4. The multi-rail module of claim 3, wherein the first set PMOS transistor and the first set NMOS transistor are small and use less power than the second set PMOS transistor and the second set NMOS transistor.

5. The multi-rail module of claim 1, wherein it is illegal for both the first logic input and the second logic input to be a logic one.

6. The multi-rail module of claim 1, wherein the PMOS transistor sources $V_{DD}$ to both the first-rail driver circuit and the second-rail driver circuit.

7. A method of designing a multi-rail module, the method comprising:
- coupling a logic output of a first-rail logic circuit to an input of a first-rail driver circuit;
- coupling a logic output of a second-rail logic circuit to an input of a second-rail driver circuit;
- sourcing $V_{DD}$ to the first-rail logic circuit and the second-rail logic circuit via a single PMOS transistor;
- driving the logic output of the first-rail logic circuit and the output of the second-rail driver $Q^1$ by a SET circuit; and
- driving the first-rail logic circuit such that the first-rail output $Q^0$ output is low when a SETB input is asserted low, and driving the second-rail driver circuit such that the second-rail output $Q^1$ output is high when the SETB input is asserted low.

8. The method of claim 7, further comprising coupling a gate of the PMOS transistor to a SLEEP input.

9. The method of claim 8, further comprising coupling a source of a first SLEEP NMOS transistor to an output of the first-rail driver $Q^0$, coupling a drain of the first SLEEP NMOS transistor to ground, and coupling a gate of the first SLEEP NMOS transistor to the SLEEP input, and coupling a source of a second SLEEP NMOS transistor to an output of the second-rail driver $Q^1$, coupling a drain of the second SLEEP NMOS transistor to ground, and coupling a gate of the second SLEEP NMOS transistor to the SLEEP input.

10. The method of claim 9, further comprising a coupling a first set PMOS transistor between $V_{DD}$ and the logic output of the first-rail logic circuit, coupling a first set NMOS transistor between the first-rail logic circuit and ground, coupling a second set PMOS transistor between $V_{DD}$ and the output of the second-rail driver $Q^1$, and coupling a second set NMOS transistor between the second-rail logic circuit and ground and the second SLEEP NMOSt transistor and ground.

11. The method of claim 7, further comprising coupling a gate of the first set PMOS transistor, a gate of the second set PMOS transistor, a gate of the first set NMOS transistor, a gate of the second set NMOS transistor to a SETB input.

12. A Sleep-Convention Logic (SCL) module having mutually exclusive outputs, the module comprising:
- a first-rail logic circuit coupled to $V_{DD}$ and coupled to ground and having a first logic input and a first logic output;
- a second-rail logic circuit coupled to $V_{DD}$ and coupled to ground and having a second logic input and a second logic output;
- a first-rail driver circuit coupled to ground, receiving the first logic output, and having a first-rail output $Q^1$;
- a second-rail driver circuit coupled to ground and receiving the second logic output and having a second-rail output $Q^0$;
- a PMOS transistor having a source coupled to $V_{DD}$, a drain coupled to the first driver circuit and the second driver circuit, and a gate driven by a SLEEP signal; and
- a SET circuit, the SET circuit driving the first-rail logic circuit such that the first-rail output $Q^0$ output is low when a SETB input is asserted low, and driving the second-rail driver circuit such that the second-rail output $Q^1$ output is high when the SETB input is asserted low;
- wherein when the SLEEP signal is low, the PMOS transistor sources $V_{DD}$ to the first driver circuit and the second driver circuit.

13. The Sleep-Convention Logic (SCL) module of claim 12, further comprising a first SLEEP NMOS transistor having a source coupled to the first-rail output, a drain coupled to ground, and a gate driven by the SLEEP signal, and a second SLEEP NMOS transistor having a source coupled to the second-rail output, a drain coupled to ground, and a gate driven by the SLEEP signal.

14. The Sleep-Convention Logic (SCL) module of claim 13, further comprising a SET circuit including
- a first set PMOS transistor having a source coupled to $V_{DD}$, a drain coupled to the first logic output, and a gate coupled to a SETB input,
- a first set NMOS transistor coupled between the first-rail logic circuit and ground, the first set NMOS transistor having a source coupled to the first-rail logic circuit, a drain coupled to ground, and a gate coupled to the SETB input,
- a second set PMOS transistor having a source coupled to VDD, a drain coupled to the second-rail output $Q^1$, and a gate coupled to a SETB input, and
- a second set NMOS transistor coupled between the second-rail driver circuit and ground, and between the second SLEEP NMOS transistor and ground, the second set NMOS transistor having a source coupled to the second-rail driver circuit and the drain of the second SLEEP NMOS transistor, a drain coupled to ground, and a gate coupled to a SETB input.

15. The Sleep-Convention Logic (SCL) module of claim 14, wherein the first set PMOS transistor and the first set NMOS transistor are small and use less power than the second set PMOS transistor and the second set NMOS transistor.

16. The Sleep-Convention Logic (SCL) module of claim 12, wherein it is illegal for both the first logic input and the second logic input to be a logic one.

17. The Sleep-Convention Logic (SCL) module of claim 12, wherein the PMOS transistor sources $V_{DD}$ to both the first-rail driver circuit and the second-rail driver circuit.

* * * * *